(12) United States Patent
Familia et al.

(10) Patent No.: US 12,362,704 B2
(45) Date of Patent: Jul. 15, 2025

(54) NOTCH FILTER CALIBRATION IN LC OSCILLATORS FOR SUPPLY NOISE REJECTION

(71) Applicant: Intel Corporation, Santa Clara, CA (US)

(72) Inventors: Noam Familia, Modiin (IL); Vadim Levin, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 706 days.

(21) Appl. No.: 17/528,907

(22) Filed: Nov. 17, 2021

(65) Prior Publication Data

US 2023/0155549 A1    May 18, 2023

(51) Int. Cl.
*H03B 5/04* (2006.01)
*H03B 5/12* (2006.01)
*H03B 5/24* (2006.01)
*H03H 7/01* (2006.01)
*H03L 1/00* (2006.01)

(52) U.S. Cl.
CPC ............. *H03B 5/24* (2013.01); *H03B 5/04* (2013.01); *H03B 5/1212* (2013.01); *H03H 7/01* (2013.01); *H03L 1/00* (2013.01); *H03B 2200/009* (2013.01); *H03B 2201/01* (2013.01); *H03H 2007/013* (2013.01)

(58) Field of Classification Search
CPC .............. H03B 5/04; H03B 5/1212; H03B 2200/0088; H03B 2200/009; H03L 1/00; H03L 5/00; H03L 5/02
See application file for complete search history.

(56) References Cited

U.S. PATENT DOCUMENTS

| | | | | |
|---|---|---|---|---|
| 4,000,468 A * | 12/1976 | Brown | ............... | H03L 7/185 455/168.1 |
| 5,281,930 A * | 1/1994 | Taromaru | ............... | H03C 3/095 455/208 |
| 5,604,466 A * | 2/1997 | Dreps | ............... | H03K 3/2821 331/25 |
| 5,642,081 A * | 6/1997 | Bosch | ............... | H03B 23/00 331/4 |
| 6,246,294 B1 * | 6/2001 | Gai | ............... | H03L 7/18 331/25 |
| 7,042,302 B2 * | 5/2006 | Chien | ............... | H03B 5/04 331/185 |
| 7,973,518 B2 | 7/2011 | Shor et al. | | |

(Continued)

*Primary Examiner* — Levi Gannon
(74) *Attorney, Agent, or Firm* — Schwabe, Williamson & Wyatt, P.C.

(57) ABSTRACT

Embodiments herein relate to an apparatus and method for calibrating a notch filter which filters a power supply signal for a voltage-controlled oscillator (VCO). In one aspect, a control circuit performs a number of calibration cycles for the filter to determine a value of a calibration code for the filter which minimizes a change in a frequency of the output signal of the VCO due to a change in the voltage of the power supply signal. After each calibration cycle, the calibration code is adjusted based on whether the frequency of the output signal increase or decreases. The calibration cycles can therefore converge on an optimal calibration code which minimizes the change in frequency due to the change in voltage. This minimizes a sensitivity of the VCO to noise in the power supply signal.

18 Claims, 9 Drawing Sheets

(56) References Cited

U.S. PATENT DOCUMENTS

| | | | |
|---|---|---|---|
| 8,072,281 B2 | 12/2011 | Hanafi et al. | |
| 8,319,568 B2 | 11/2012 | Sun | |
| 8,362,848 B2* | 1/2013 | Raghunathan | H03L 7/24 |
| | | | 327/158 |
| 8,994,460 B2 | 3/2015 | Kesselring et al. | |
| 9,000,857 B2* | 4/2015 | Lahiri | H03L 7/0995 |
| | | | 327/543 |
| 10,944,411 B1 | 3/2021 | Elzinga et al. | |
| 11,184,014 B2* | 11/2021 | Tsai | H03L 1/00 |
| 2006/0122529 A1* | 6/2006 | Tsau | H03F 3/45 |
| | | | 600/544 |
| 2006/0211393 A1* | 9/2006 | Chien | H03L 7/099 |
| | | | 455/265 |
| 2007/0085534 A1* | 4/2007 | Seki | G01R 33/0358 |
| | | | 324/248 |
| 2008/0068056 A1* | 3/2008 | Poulton | H03L 7/099 |
| | | | 327/156 |
| 2013/0076450 A1 | 3/2013 | Rao et al. | |

* cited by examiner

NOTCH FILTER CALIBRATION IN LC OSCILLATORS FOR SUPPLY NOISE REJECTION

FIELD

The present application generally relates to the field of circuits, and more specifically, to an oscillator.

BACKGROUND

An oscillator is a fundamental component of many circuits. For example, a voltage-controlled oscillator (VCO) is a type of oscillator in which the frequency of the output oscillations are varied as a function a voltage of an input voltage signal. A VCO can be used for frequency modulation (FM) or phase modulation (PM) by applying a modulating signal to a control input. A VCO can also be an integral part of a phase-locked loop (PLL). VCOs are also used in synthesizers such as for musical instruments. However, various challenges are presented in operating a VCO.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
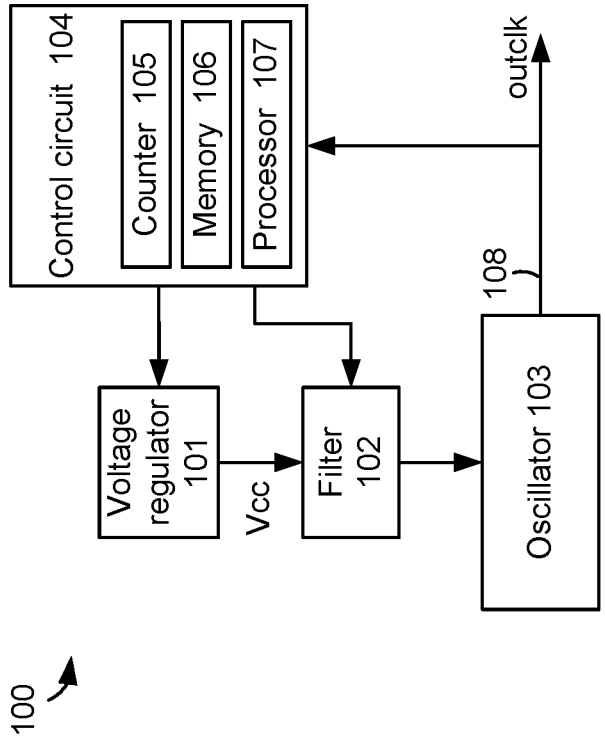
FIG. 1 illustrates an example circuit 100 which includes a voltage regulator 101 which provides a power supply signal, a filter 102, a voltage-controlled oscillator (VCO) 103, and a control circuit 104 for calibrating the filter to minimize a sensitivity of the VCO to noise in the power supply signal.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, an oscillator such as a VCO has many different applications. A VCO provides an output signal which is a function of an input power supply voltage signal which may be received from a voltage regulator, for example. However, the power supply signal has noise which is manifested in small variations in the voltage. These variations in turn can cause variations in the frequency of the output signal of the VCO. In fact, power supply noise has becomes a dominant source of jitter in inductive-capacitance (LC) types of digitally-controlled VCOs. Such VCOs are widely used in high speed interfaces, including in PLLs in transmitters and in clock data recovery (CDR) circuits in receivers. The VCO can be used in RF signal generators, frequency mixers, tuners, sine wave generators, RF modulators, voltage-controlled crystal oscillators (VCXOs), electronic jamming equipment, function generators and in the production of electronic music.

One approach is to use a separate reference voltage to mitigate low frequency supply noise, such as an integrated band-gap or an external clean reference. However, a band-gap circuit is a very process-sensitive circuit and the provision of an external voltage would be costly. Also, on-die voltage regulators are not able to filter very low frequency noise because their reference voltage tracks a supply voltage.

The techniques provided herein address the above and other issues by providing an apparatus and method for calibrating a notch filter which filters a power supply signal for a VCO. In one aspect, a control circuit performs a number of calibration cycles for the filter to determine a value of a calibration code for the filter which minimizes a change in a frequency of the output signal of the VCO due to a change in the voltage of the power supply signal. The calibration code can begin at an initial value. After each calibration cycle, the calibration code is adjusted based on whether the frequency of the output signal increase or decreases. In one approach, if the frequency increases, the calibration code is decreased to reduce the notch frequency of the filter and if the frequency decreases, the calibration code is increased to increase the notch frequency of the filter. The calibration cycles can therefore converge on an optimal calibration code which minimizes the change in frequency due to the change in voltage. The technique minimizes a sensitivity of the VCO to noise in the power supply signal.

The above and other advantages are discussed further below.

FIG. 1 illustrates an example circuit 100 which includes a voltage regulator 101 which provides a power supply signal, a filter 102, a voltage-controlled oscillator (VCO) 103, and a control circuit 104 for calibrating the filter to minimize a sensitivity of the VCO to noise in the power supply signal. The voltage regulator 101 is an integrated circuit (IC) that can provide a constant output voltage regardless of a change in the load or input voltage. In one approach, the voltage regulator is a linear regulator, which works by automatically adjusting the resistance via a feedback loop, accounting for changes in both load and input. In another approach, the voltage regulator is a switching regulator such as a buck (step-down), boost (step-up) and buck-boost (step-up/step-down) voltage regulator. Switching regulators are more efficient in terms of power conversion while linear regulators work well in low-voltage applications.

The voltage regulator provides a direct-current (DC) power supply signal with an output voltage Vcc (Voltage Common Collector) to a filter 102. This is the power input for the VCO. The filter 102 can comprise one or more notch filters which filter noise from the power supply signal. The oscillator 103 can be an LC type VCO, as discussed, which provides an output signal, outclk, on an output path 108. See FIG. 3 for further details. The output signal oscillates with a frequency. When the output signal is used as a clock signal for another component in a circuit such as a processor core, the output signal may be a square waveform. In other applications, the output signal may have a sinusoidal waveform, a sawtooth waveform or other waveform shape.

A linear VCO is generally used to produce a sine wave or clock signal. In this case, an LC tank circuit is used for producing oscillations. A relaxation-type VCO is used to produce a sawtooth or triangular waveform.

The control circuit is coupled to the voltage regulator to set a voltage of the power supply signal, e.g., during a calibration process for the filter or during normal operations of the VCO. The normal operations refer to operations other than the calibration process for the filter. The control circuit can be a state machine, synthesized logic or other type of circuit, and can include a counter 105, a memory 106 and a processor 107.

The counter 105 is coupled to the output path 108 of the VCO to count pulses in the output signal and thereby determine the frequency of the output signal. The counter can detect the rise or fall of each cycle of the output clock, outclk. The counter can be a sequential digital logic circuit with an input line and multiple output lines. The values on the output lines represent a number in the binary or binary-coded decimal (BCD) number system. Each clock pulse applied to the input line increments the number. The output signal can be sampled in a time window to determine the frequency as number of clock pulses divided by the time window. The counter circuit can comprise a number of flip-flops connected in cascade.

The memory 106 can store instructions for execution by the processor 107. The memory can be a non-transitory tangible machine readable medium such as read only memory (ROM), random access memory (RAM), or flash memory, for example. The instructions can comprise firmware or software, for example.

The control circuit can perform a calibration process for the filter which involves multiple calibration cycles. In each cycle, a value of the calibration code is set, and the voltage regulator is instructed to output a first voltage and then a different, second voltage. These voltages are output sequentially, one after the other. For example, the second voltage can be slightly higher than the first voltage. The VCO receives the power supply signal of the voltage regulator as filtered by the filter with the current calibration code. The VCO provides an output signal based on the received power supply signal. The counter detects a first frequency of the output signal when the power supply signal has the first voltage and a second frequency of the output signal when the power supply signal has the second voltage. The control circuit then determines an adjustment to the calibration code based on the comparison between the two frequencies. Additional details of the technique are discussed further below.

Optionally, the control circuit can be used to calibrate multiple filters which are associated with multiple respective VCOs and one or more voltage regulators.

Figure 3:
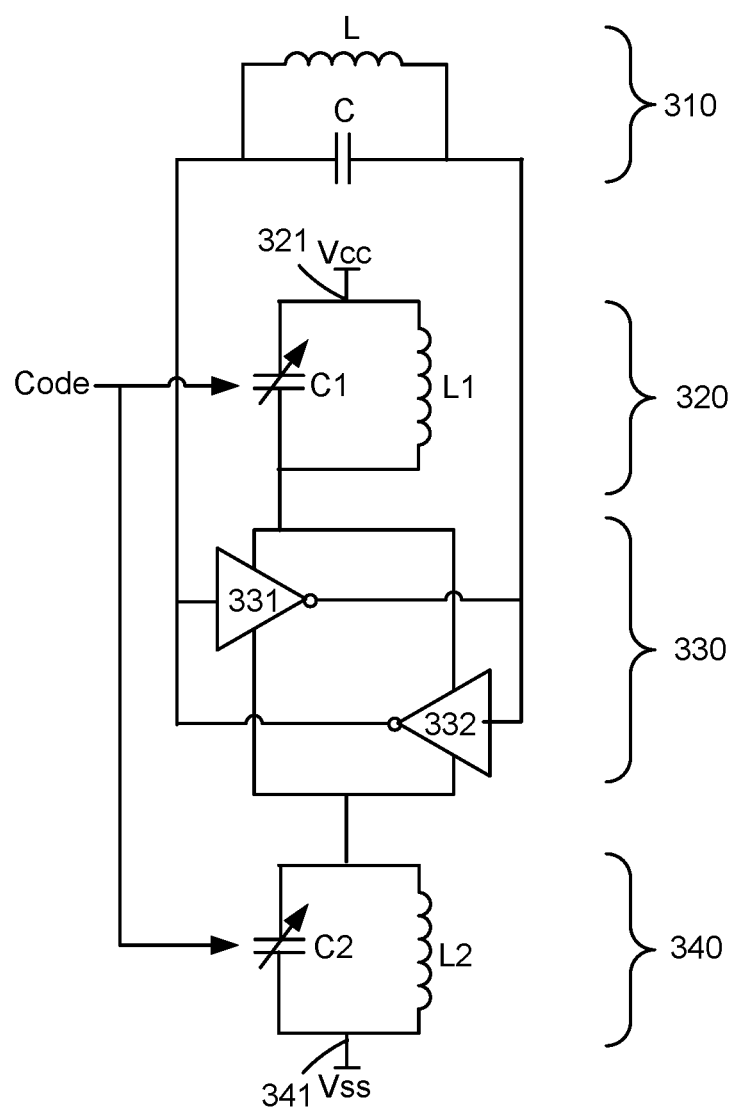
FIG. 3 depicts an example implementation of the VCO 103 and filter 102 of FIG. 1.

In one possible implementation, such as depicted in FIG. 3, multiple filters are associated with one VCO. The multiple filters for one VCO can be tuned together to obtain one common optimal calibration code for each filter, or the multiple filters for one VCO can be tuned separately to obtain a separate optimal calibration code for each filter.

Figure 2:
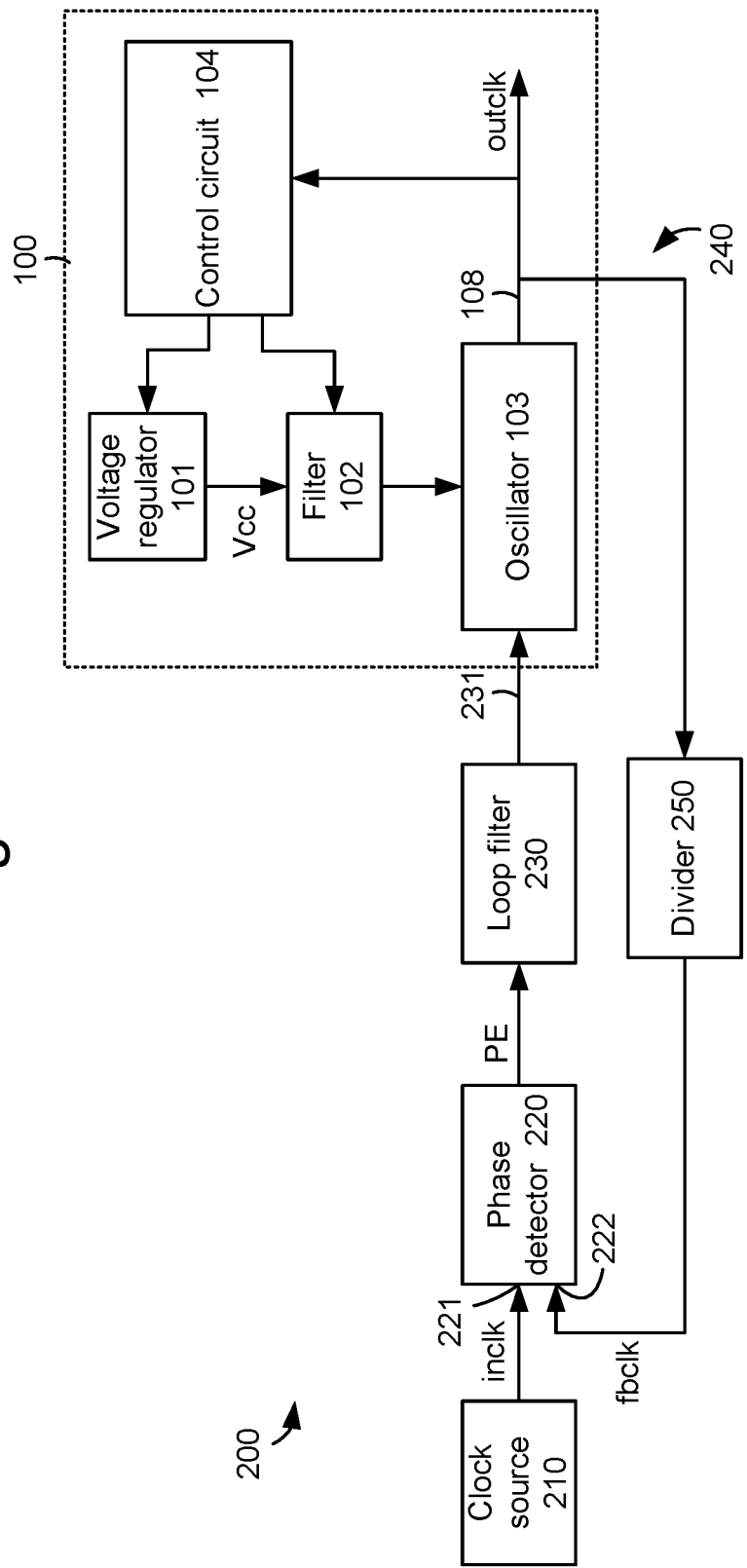
FIG. 2 depicts an example phase-locked loop (PLL) circuit 200 which includes the circuit 100 of FIG. 1.

FIG. 2 depicts an example phase-locked loop (PLL) circuit 200 which includes the circuit 100 of FIG. 1. As mentioned, one application of a VCO is in a PLL. In this case, during normal operation, e.g., operation outside of the filter calibration process, the PLL outputs a clock signal, outclk, which is phase locked to an input signal, inclk. During the calibration process, the PLL may be inactive. For example, inclk may not yet be provide.

A PLL receives an input clock signal from a clock source such as a crystal oscillator. A crystal oscillator uses the mechanical resonance of a vibrating crystal of piezoelectric material to create a fixed frequency signal. A phase detector detects a phase error between the input clock signal and a feedback signal in the PLL to generate an error signal for a loop filter. Based on the code, the loop filter instructs an oscillator to adjust the frequency of the output clock of the PLL. Additionally, the output clock is divided down in frequency at a divider circuit to provide the feedback clock. This division allows the output clock to be at a higher frequency than the input clock.

The divider circuit can perform an integer or non-integer (fractional) division. For integer division, the output clock signal is divided by one value, N, for each cycle. For fractional division, the output clock signal is divided by one value, N, for some cycles, and by another value, N+1, for other cycles, for example.

In this example, the PLL receives an input clock signal (inclk) from a clock source 210 such as a crystal oscillator. The input clock signal is received at a first input terminal 221 of a phase detector 220. A feedback clock signal (fbclk) is received at a second input terminal 222 of the phase detector. Based on a phase difference between the two input signals, the phase detector provides an output signal (a phase error PE) to a loop filter 230. The loop filter provides a corresponding output signal on a path 231 to control the oscillator 103. The oscillator provides the clock signal, outclk, on the path 108. For example, the phase detector, loop filter and oscillator can be digitally-implemented, in which case the signals output by the phase detector and the loop filter are digital codes or code words.

In one possible implementation, a digital phase detector can comprise an exclusive-OR (XOR) logic gate. When the two signals being compared are completely in-phase, the XOR gate's output will have a constant level of zero. When the two signals differ in phase, the XOR gate's output will be high for a portion of each cycle which is proportional to the difference in phase. The output of the XOR gate thus changes duty cycle in proportion to the phase difference. The output can be applied to a low-pass filter to obtain an analog voltage that is proportional to the phase difference between the two signals. The phase difference can then be converted to a code word using an analog-to-digital converter. The input clock signals can be square waves.

In other possible implementations, a digital phase detector can be based on a sample and hold circuit, a charge pump, or a logic circuit comprising flip-flops. In another approach, the phase detector has an analog implementation.

The loop filter converts the signal representing the phase difference to a signal on the path 231 for the oscillator 103. For example, in an all-digital implementation of the PLL, a digital loop filter can convert a code word representing the phase difference from the phase detector to a code word representing an output frequency, or a change in an output frequency, for the digitally-controlled oscillator on the path 231. The digital loop filter may be a proportional-integral filter which includes a proportional gain summed with an output of an integrator. The path 231 may be a digital bus, in this case, and the oscillator may be a synthesized digitally-controlled oscillator.

Alternatively, in a hybrid digital implementation, the path 131 may be coupled to a digital to analog converter (DAC) which, in turn is coupled to an analog oscillator. The DAC translates the code provided by the loop filter to an analog signal for controlling the oscillator.

In either case, the oscillator adjusts its output clock signal, outclk, based on the signal received from the filter, such that the loop filter controls the frequency and phase of the oscillator.

Outclk is also provided on a feedback path 240 of the PLL which is coupled to the second input terminal 222 of the phase detector. The feedback path includes a divider 250. Outclk is divided in frequency by the divider to provide fbclk as a divided version of outclk. For example, assume it is desired to provide outclk at a frequency (f)=10 GHz and that the frequency of inclk is 100 MHz. In this case, outclk can be divided by 100 in each cycle.

The VCO alone, or in a PLL, can be integrated in a Very Large Scale Integration (VLSI) device as a circuit within a chip.

FIG. 3 depicts an example implementation of the VCO 103 and filter 102 of FIG. 1. The VCO can include a main tank 310 which comprises an inductive coil or inductor L connected in parallel with a capacitor C. The values of the inductance and capacitance determine the frequency of oscillations produced by the circuit. Energy is transferred back and forth between the inductive coil and the capacitor to provide oscillations.

In one option, a varactor (varicap) diode can be used in place of the capacitor C in the tank circuit. A varactor diode is a type of semiconductor diode whose capacitance across the junction can be varied by varying the voltage across the junction. By varying the voltage across the varicap diode in the tank circuit, the output frequency of the VCO can be varied.

A first notch filter 320 is connected to the power supply signal Vcc at a node 321. The filter includes a capacitor C1 having a variable capacitance in parallel with an inductor L1. The capacitance can be adjusted based on a calibration code provided by the control circuit. The variable capacitance can be provided by a number of different capacitors which can be selectively turned on or off based on the code. The filter can be a 2f notch filter which has a default band stop at twice the frequency (the second harmonic) of the running or operating frequency of the output signal of the VCO. The band stop can be tuned using a calibration code as discussed herein.

An active gain circuit 330 is connected to the first notch filter 320 and includes cross-coupled inverters 331 and 332 for providing a gain to the VCO. The active gain circuit is used for amplifying the output of the LC tank circuit, compensating for the energy lost in the tank circuit and establishing the necessary feedback conditions.

A second notch filter 340 is coupled to the active gain circuit 330. The second notch filter is further connected to a source supply voltage (Vss) such as ground (0 V) at a node 341. The filter includes a capacitor C2 having a variable capacitance in parallel with an inductor L2. As in the first notch filter, the capacitance can be adjusted based on a calibration code provided by the control circuit. This filter also can be a 2f notch filter.

The two notch filters allow powering of the VCO without a need for a tail current and provide good phase noise performance. While tuning their resonance frequency to exactly 2×Fdco would optimize phase noise, introducing a small offset cancels out Kvcc at the expense of slight increase in phase noise, as discussed herein. See FIGS. 4C and 4D, for example.

Figure 4A:
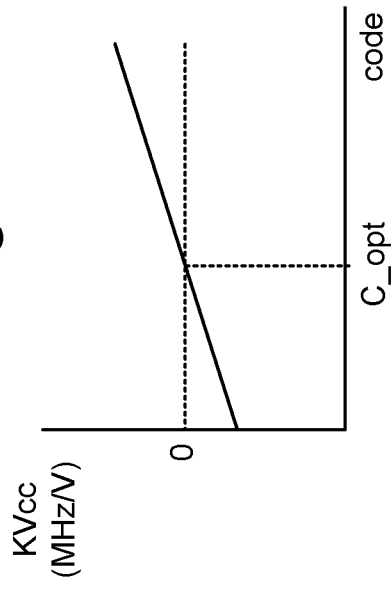
FIG. 4A depicts an example plot of gain versus frequency for the filter 102 of FIG. 1.

FIG. 4A depicts an example plot of gain versus frequency for the filter 102 of FIG. 1. As mentioned, the filter can be a notch filter with a notch or band stop at a frequency F_notch. The width of the notch can also be configured. The filter passes all frequencies except for those in the notch. F_notch can be tuned using the techniques discussed herein to filter out noise in the power supply signal in a way which minimizes the sensitivity of the VCO's output frequency to the noise.

Figure 4B:
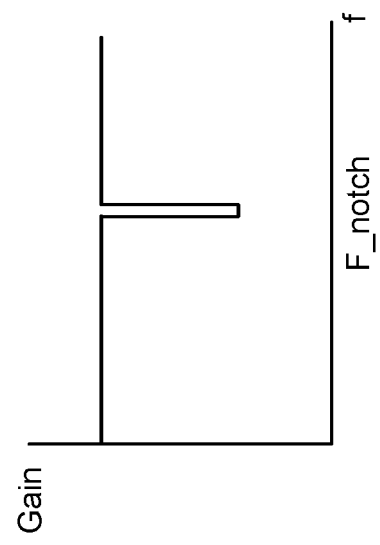
FIG. 4B depicts an example plot of the notch frequency, F_notch, of FIG. 4A as a function of a calibration code.

FIG. 4B depicts an example plot of the notch frequency, F_notch, of FIG. 4A as a function of a calibration code. The calibration code can extend from 1-256 in decimal numbers, for example, when an eight-bit code is used. Each bit change in the code can represent a change in F_notch. In one approach, lower values of the code correspond to lower values of F_notch and higher values of the code correspond to higher values of F_notch. Moreover, in the example depicted, F_notch increases linearly with the code.

Figure 4C:
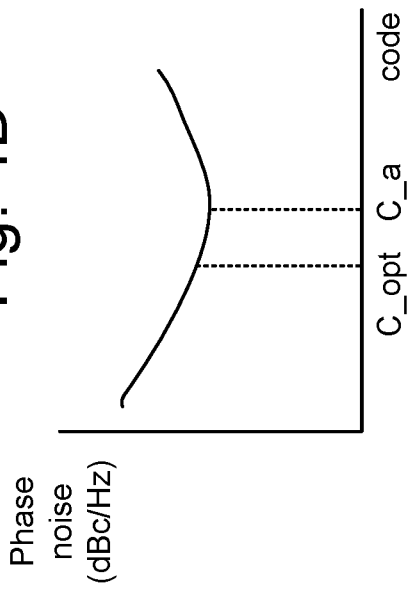
FIG. 4C depicts an example plot of a frequency-to-voltage sensitivity of the VCO 103 as a function of the calibration code.

FIG. 4C depicts an example plot of a frequency-to-voltage sensitivity of the VCO 103 as a function of the calibration code. KVcc, the sensitivity, can be expressed in units of MHz/V. This represents a change in the VCO's output frequency due to a change in the input voltage from the filter. Ideally, the input voltage is a requested fixed level. However, due to noise, the voltage can vary higher and lower than the requested fixed level, leading to corresponding variations in the VCO's output frequency. The solid line indicates that KVcc changes as the code changes. The change is depicted as being linear as a simplification. KVcc increases monotonically as the code increases in this example. Additionally, a single relationship is depicted for simplicity. In practice, the relationship between KVcc and the code can be different for different circuits, and at different times for the same circuit. For example, process-voltage-temperature (PVT) variations can change the relationship. Process variations refer to variations in the fabrication process. Voltage variations refer to variations of the available supply voltage on the circuit. Temperature variations are also a factor as the environment of the circuit changes. The calibration techniques described herein automatically accommodate these variations.

In the filter calibration process, different values of the code are used to obtain corresponding values of KVcc. For an optimal code, C_opt, which is determined by the process, KVcc is at or close to zero. This condition is optimal since the VCO's output frequency will no longer vary due to noise in the power supply signal. Instead, a very stable and clean output signal can advantageously be obtained.

Figure 4D:
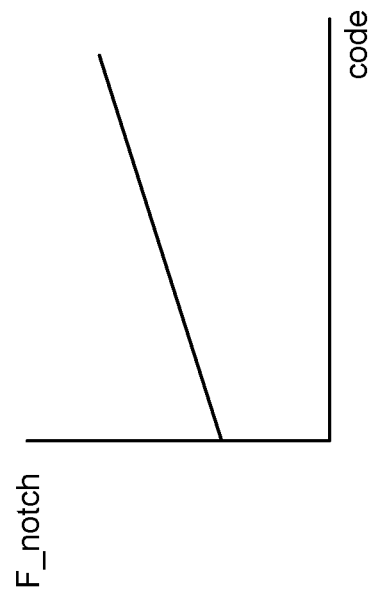
FIG. 4D depicts an example plot of a phase noise of the VCO as a function of the calibration code, consistent with FIG. 4C.

FIG. 4D depicts an example plot of a phase noise of the VCO as a function of the calibration code, consistent with FIG. 4C. The horizontal axes of FIGS. 4C and 4D are aligned. Separate from the filter calibration process, the phase noise of the power supply signal can be optimally reduced by tuning the resonant frequency of the notch filter. As a default or initial setting, the resonant frequency can be tuned to exactly twice the running frequency of the VCO. The phase noise refers to noise due to the operation of the phase detector in a PLL as the phase detector make constant adjustments to the requested VCO output frequency. The phase noise can be expressed in units of decibels over Hertz. dBc is the power ratio of the noise signal to a carrier signal.

It has been determined that it can be more advantageous to optimize the notch filters for the power supply noise of the voltage regulator rather than the phase noise. In this example, the phase noise is minimal at a code value of C_a, which is slightly different than the code value C_opt which optimizes for the power supply noise. However, this represents only a minor increase in phase noise. Moreover, the increase stability, e.g., reduced jitter, due to the optimizing for the power supply noise can in turn reduce phase noise.

Figure 5A:
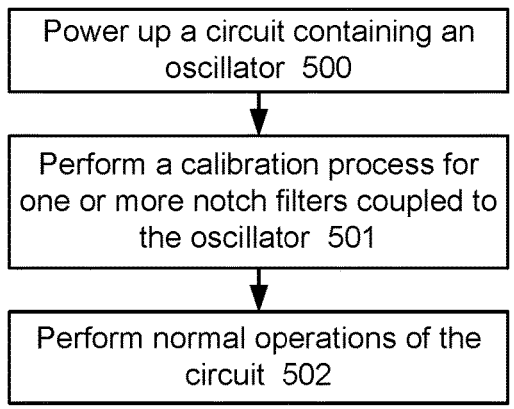
FIG. 5A depicts a flowchart of an example process for operating a VCO including calibrating an associated notch filter such as the filter 102 of FIG. 1.

FIG. 5A depicts a flowchart of an example process for operating a VCO including calibrating an associated notch filter such as the filter 102 of FIG. 1. Step 500 includes powering up a circuit containing an oscillator. Step 501 includes performing a calibration process for one or more notch filter coupled to the oscillator. Step 502 includes performing normal operations of the circuit.

Generally, the calibration process to minimize KVcc can be done as part of the calibration of the VCO such as in a PLL. This process can first include powering up the circuits. A second step is to lock the output of the voltage regulator. A third step is to perform automatic frequency calibration (AFC) of the VCO, e.g., a coarse frequency calibration. For example, the frequency of the VCO's output signal can be shifted in large steps toward a target frequency by applying digital commands to the VCO. This can involve switching in or out various discrete coarse tuning elements to shift the VCO output frequency in large steps. A fourth step is to tune or calibrate the notch filters such as depicted in FIG. 5C to minimize KVcc. A fifth step is to again perform the AFC calibration, since tuning the notch filters can slightly shift the frequency of the VCO's output signal. A sixth step is to continue with the remainder of the locking sequence in a PLL. For example, this can involve running the PLL to allow the phase detector and loop filter to provide a fine frequency tuning of the VCO.

In one approach, to prepare the oscillator for normal operations in a PLL after powering up the PLL, the control circuit is to perform a coarse adjustment of the frequency of the output signal before and after the performance of the calibration cycles.

Figure 5B:
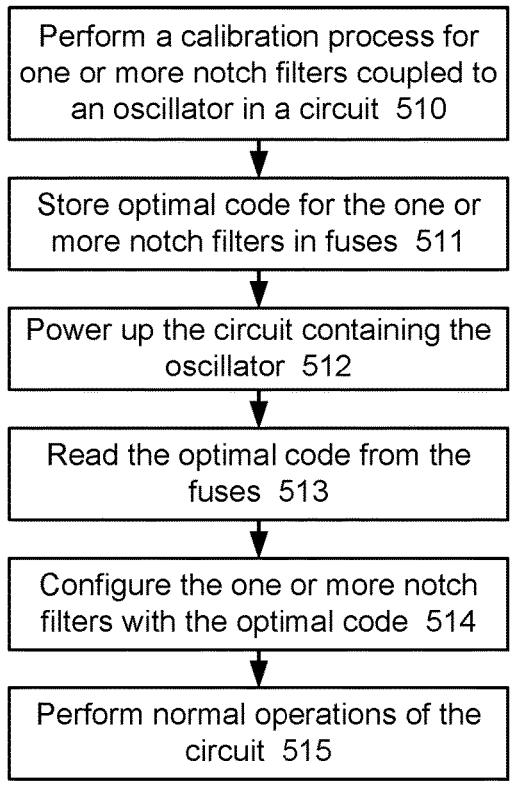
FIG. 5B depicts a flowchart of an example process for operating a VCO including calibrating an associated notch filter such as the filter 102 of FIG. 1, and storing an optimal calibration code in fuses for later use.
Figure 5C:
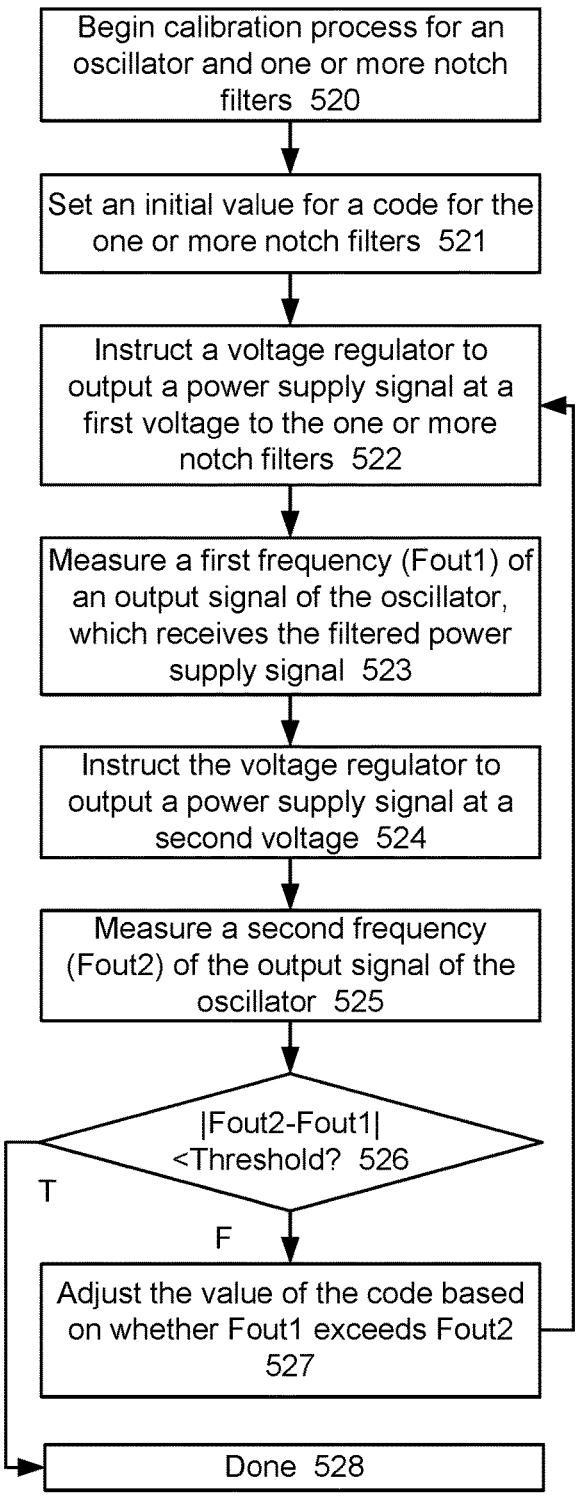
FIG. 5C depicts a flowchart of an example process for calibrating a notch filter of a VCO.

FIG. 5B depicts a flowchart of an example process for operating a VCO including calibrating an associated notch filter such as the filter 102 of FIG. 1, and storing an optimal calibration code in fuses for later use. Step 510 includes performing a calibration process for one or more notch filters coupled to an oscillator in a circuit. Step 511 includes storing the optimal code for the one or more notch filters in fuses. See, e.g., the fuses 921 of FIG. 9. For example, steps 510 and 511 can be performed when the circuit is being tested by the manufacturer, prior to the release to the end user or customer. Step 512 includes powering up the circuit containing the oscillator. Step 513 includes reading the optimal code from the fuses. Step 514 includes configuring the one or more notch filters with the optimal code. Step 515 includes performing normal operations of the circuit.

Thus, the calibration of the filter can be performed at a different time than when the filter and VCO are used operationally. This approach saves time since the calibration is already done. The calibration result can be quickly read from the fuses or other non-volatile storage location each time the VCO is powered up.

FIG. 5C depicts a flowchart of an example process for calibrating a notch filter of a VCO. In one approach, the process is performed each time the VCO is powered up. Step 520 begins a calibration process for an oscillator and one or more notch filters. Step 521 sets an initial value for the code for the one or more notch filters. In one approach, the code value is midway between a lowest and highest code value. See FIG. 7A, for example. For example, the initial code can be 128 when the lowest and highest code values are 1 and 256, respectively. In another approach, the initial code value is one which tunes the one or more notch filters to twice a running frequency of the output signal. Step 522 includes instructing the voltage regulator to output a power supply signal at a first voltage to the one or more notch filters. For example, the control circuit can transmit a corresponding signal to the voltage regulator.

Step 523 includes measuring a first frequency (Fout1) of an output signal of the oscillator, which receives the filtered power supply signal. For example, this can be done using a counter, as discussed. The count is representative of the frequency. Step 524 includes instructing the voltage regulator to output a power supply signal at a second voltage to the one or more notch filters. Step 525 includes measuring a second frequency (Fout2) of the output signal of the oscillator. A decision step 526 can be used to determine whether the absolute value of the different between Fout1 and Fout2 is less than a threshold. If the decision step is true (T), the process is done at step 528. If the decision step is false (F), step 527 includes adjusting the value of the code based on whether Fout1 exceeds Fout2.

Step 526 provides one possible test to determine if the process is done such that it has converged on an optimal code. Other tests are possible. For example, a change in the polarity of Fout2−Fout1 can signal convergence. In this case, if the code is gradually incremented linearly such that Fout2−Fout1 is positive for many calibration cycles but then changes to negative, this signifies that Kvcc has changed from positive to negative polarity and therefore has just crossed over the optimal KVcc=0 point. Similarly, if Fout2−Fout1 is negative for many calibration cycles but then changes to positive, this signifies that KVcc has changed from negative to positive polarity and therefore has just crossed over the optimal KVcc=0 point. The value of the code just before or just after the change in polarity can be selected as the optimal code, in one approach. See, e.g., the example of FIG. 6.

In another option, a binary search process can be used to determine the optimal code. See, e.g., the example of FIGS. 7A and 7B.

In one option, the customer can be provided an option to disable the calibration process, such as in the case of a noisy platform or in case power supply noise is not an issue. Registers to enable this feature, as well as an option to override the notch filter settings, can be allocated in logic of the control circuit.

Figure 6:
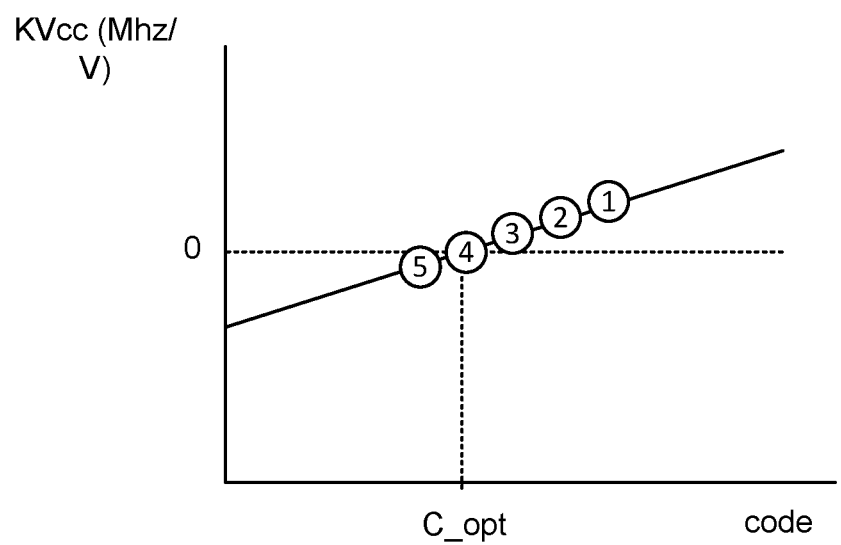
FIG. 6 depicts a plot of an example calibration process consistent with FIG. 5C, where the calibration code is initially higher than optimal and then decreases in successive calibration cycles to converge at an optimal code, C_opt.

FIG. 6 depicts a plot of an example calibration process consistent with FIG. 5C, where the calibration code is initially higher than optimal and then decreases in successive calibration cycles to converge at an optimal code, C_opt. The vertical axis depicts KVcc, a change in the frequency of the VCO's output signal divided by a change in voltage of the power supply signal, and the horizontal axis depicts the calibration code of the filter. The goal of the process is to find the code which results in a KVcc as close to zero as possible. The circled numbers 1-5 represent the KVcc values obtained in the first-fifth calibration cycles, respectively. After the first cycle, KVcc>0 (see "1"). As a result, the code is adjusted to a lower value, e.g., one bit lower. This is an incremental linear approach in which the code is changed by one bit, e.g., a smallest possible unit or increment, in each calibration cycle. This approach allows the optimal code to be found gradually while avoiding a complex search algorithm. This approach involves either continuously increasing or decreasing the code depending on the initial polarity of KVcc, until the polarity changes.

For example, the code may comprise a byte of data ranging from 1-256 in decimal values, where the code=128 for the first calibration cycle. This code is at the midpoint of the range of code values. Based on the polarity of KVcc as determined by the first calibration cycle, each increment can adjust the code either higher or lower by one in decimal value.

In this example, the code is reduced by one unit after the first calibration cycle since KVcc>0. KVcc>0 after the second calibration cycle, as denoted by "2," so that the code is again reduced by one unit. KVcc>0 after the third calibration cycle, as denoted by "3," so that the code is again reduced by one unit. KVcc>0 after the fourth calibration cycle, as denoted by "4," so that the code is again reduced by one unit. However, in a polarity change, KVcc<0 after the fifth calibration cycle, as denoted by "5." At this time, the optimal code can be taken as the code corresponding to "4" or "5." Whichever of these two codes results in the lowest magnitude of KVcc can be taken as the optimal code.

Note that in FIG. 6, the control circuit can calculate KVcc, in one option. For example, the power supply signal may change from 5 V to 5 V+50 mV and the frequency of the VCO's output signal may change from 10 GHz to 10 GHz+100 MHz. In this case, KVcc=100 MHz/50 mV. The change in the voltage of the power supply signal in each calibration cycle can be less than 5%, for example.

In another option, the control circuit can calculate the change in frequency without dividing it by the change in voltage, on the assumption that the change in voltage is the same in each calibration cycle. In another option, the control circuit can use a change in counts from the counter to represent a change in frequency. These approaches all provide a metric of sensitivity of the VCO to changes in the power supply level.

Figure 7A:
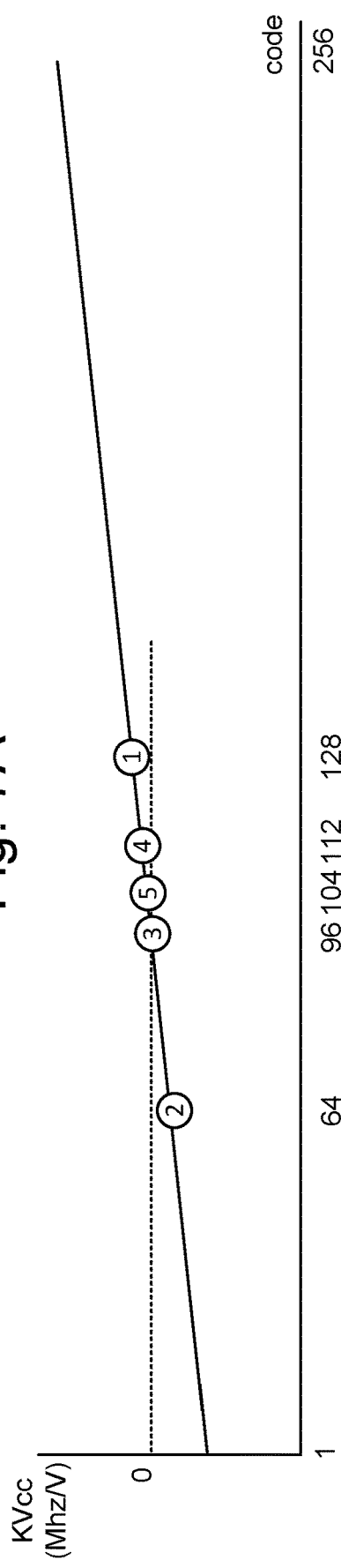
FIG. 7A depicts a plot of an example calibration process consistent with FIG. 5C, where a binary search process is performed to determine an optimal code, C_opt.
Figure 7B:
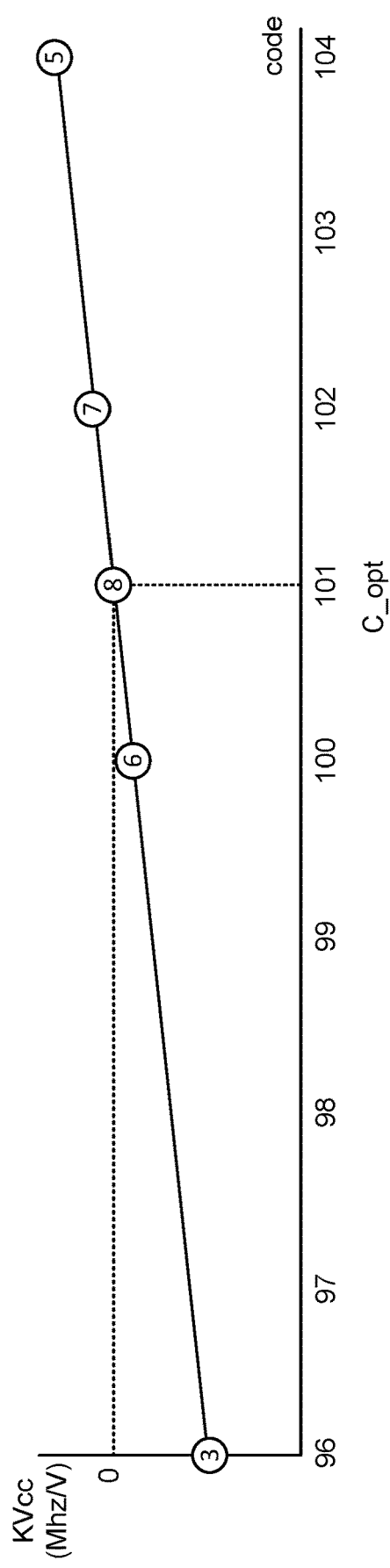
FIG. 7B depicts a plot of a continuation of the example calibration process of FIG. 7A.

FIG. 7A depicts a plot of an example calibration process consistent with FIG. 5C, where a binary search process is performed to determine an optimal code, C_opt. In FIG. 7A, the axes are the same as in FIG. 6. In FIG. 7B, the horizontal axis corresponds to codes 96-104 in a close up view to show more detail. The binary search process essentially divides a range of code value in half in each calibration cycle. For example, for the first calibration cycle, the code is 256/2=128. The KVcc which results is greater than zero and is represented by the circled "1." In the second calibration cycle, the code is adjusted lower by dividing 128 in half to obtain code=64 as represented by the circled "2." The KVcc which results is less than zero. Accordingly, in the third calibration cycle, the code is adjusted higher by dividing 128−64 in half to obtain 32, and adding this to 64 to obtain code=96 as represented by the circled "3." The KVcc which results is again less than zero. Accordingly, in the fourth calibration cycle, the code is adjusted higher by dividing 128−96 in half to obtain 16, and adding this to 96 to obtain code=112 as represented by the circled "4." The KVcc which results is now greater than zero.

FIG. 7B depicts a plot of a continuation of the example calibration process of FIG. 7A. Continuing the calibration process from above, since KVcc>0 in the fourth calibration cycle, in the fifth calibration cycle, the code is adjusted lower by dividing 112−96 in half to obtain 8, and subtracting this from 112 to obtain code=104 as represented by the circled "5." The KVcc which results is still greater than zero. Accordingly, in the sixth calibration cycle, the code is adjusted lower by dividing 104−96 in half to obtain 4, and subtracting this from 104 to obtain code=100 as represented by the circled "6." The KVcc which results is now less than zero. Accordingly, in the seventh calibration cycle, the code is adjusted higher by dividing 104−100 in half to obtain 2, and adding this to 100 to obtain code=102 as represented by the circled "7." The KVcc which results is now greater than zero. Accordingly, in the eight calibration cycle, the code is adjusted lower by dividing 102−100 in half to obtain 1, and subtracting this from 102 to obtain code=101 as represented by the circled "8." At this point, there is no further division to be performed in the binary search process such that the process is complete and the optimal code, C_opt=101. The binary search process can potentially be faster than the incremental linear approach of FIG. 6.

Figure 8A:
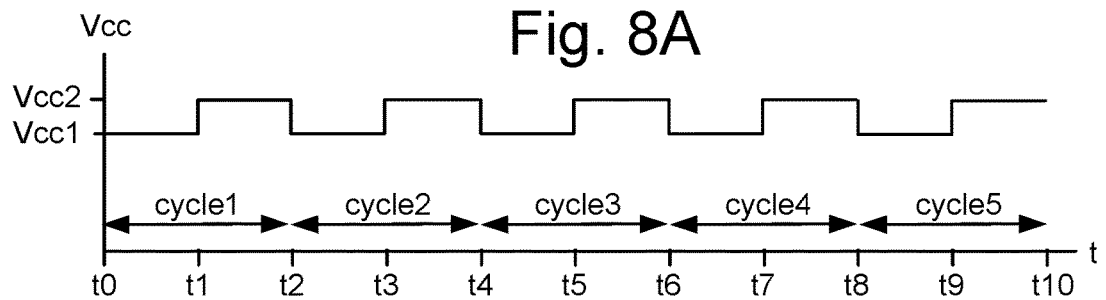
FIG. 8A is an example plot of Vcc versus time in a calibration process consistent with FIG. 5C.

FIG. 8A is an example plot of Vcc versus time in a calibration process consistent with FIG. 5C. FIG. 8A-8D have a common time line with time points t0-t1. As mentioned, the power supply voltage can be changed from a first voltage, Vcc1, to a higher second voltage, Vcc2, in each calibration cycle, while the calibration code is fixed within a calibration cycle but varies over successive calibration cycles. In this example, the voltage is increased from a lower voltage to a higher voltage in the calibration cycle. In another approach, the voltage is decreased from a higher voltage to a lower voltage in a calibration cycle.

The example includes five calibration cycles, consistent with FIG. 6. Cycle1-cycle5 extend from t0-t2, t2-t4, t4-t6, t6-t8 and t8-t10, respectively. Vcc=Vcc1 at t0-t1, t2-t3, t4-t5, t6-t7 and t8-t9 in cycle1-cycle5, respectively. Vcc=Vcc2 at t1-t2, t3-t4, t5-t6, t7-t8 and t9-t10 in cycle1-cycle5, respectively.

Figure 8B:
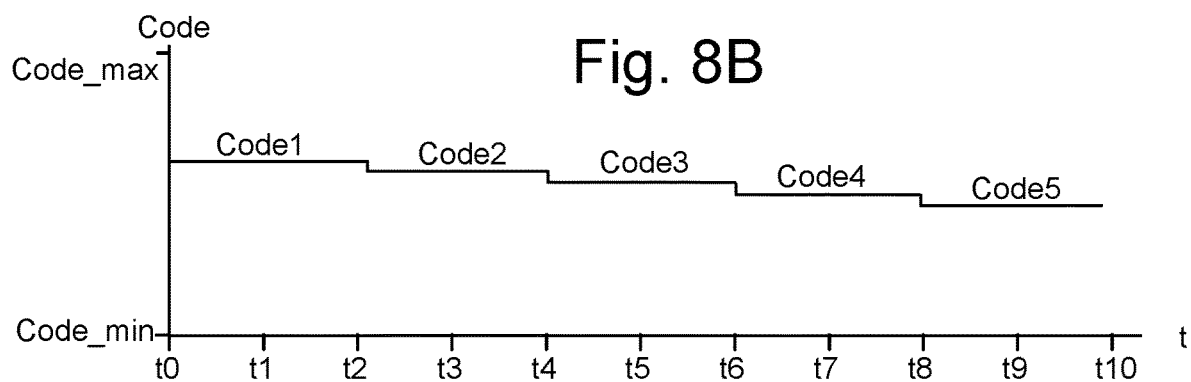
FIG. 8B is an example plot of a calibration code versus time in a calibration process consistent with FIG. 8A.

FIG. 8B is an example plot of a calibration code versus time in a calibration process consistent with FIG. 8A. The code values range from a minimum, code_min, e.g., 1, to a maximum, code_max, e.g., 256. The code values are code1-code5 in cycle1-cycle5, respectively. This example is consistent with FIG. 6 in that the code value decreases by one unit in each consecutive calibration cycle after the first cycle.

Figure 8C:
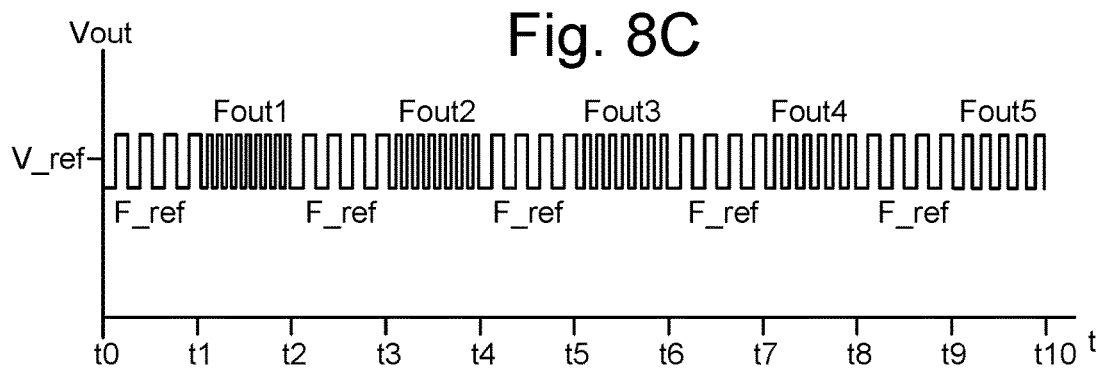
FIG. 8C is an example plot of an output voltage of the VCO 103 of FIG. 1 in a calibration process consistent with FIGS. 8A and 8B.

FIG. 8C is an example plot of an output voltage of the VCO 103 of FIG. 1 in a calibration process consistent with FIGS. 8A and 8B. As mentioned, the frequency of the VCO's output signal varies in response to the change in the voltage of the power supply signal and the amount of noise in the signal after it is filtered by the one or more notch filters. A few cycles of the output signal are shown in a simplified way. The output signal oscillates in amplitude (voltage) relative to a reference voltage, V_ref. When the power supply voltage is at Vcc1, from t0-t1, t2-t3, t4-t5, t6-t7 and t8-t9 in cycle1-cycle5, respectively, the VCO's output signal is at a reference frequency of F_ref. For example, this could by 10 GHz. Consistent with FIG. 6, the frequency is relatively high, at Fout1, from t1-t2. The frequency becomes gradually lower at Fout2, Fout3, Fout4 and Fout5 in t2-t3, t4-t5, t6-t7 and t8-t9, respectively. In this example, Fout1>Fout2>Fout3>Fout4>Fout5.

Note that while the VCO's output frequency is indicated as being the same, at F_ref, when Vcc1 is applied in each calibration cycle, it is possible that the output frequency varies at these times as a function of the calibration code. For this reason, the change in the frequency due to a change in the power supply voltage while the calibration code is fixed in a calibration cycle yields a relevant result. Also, these examples have a same change in voltage within each calibration cycle to obtain comparable results.

Figure 8D:
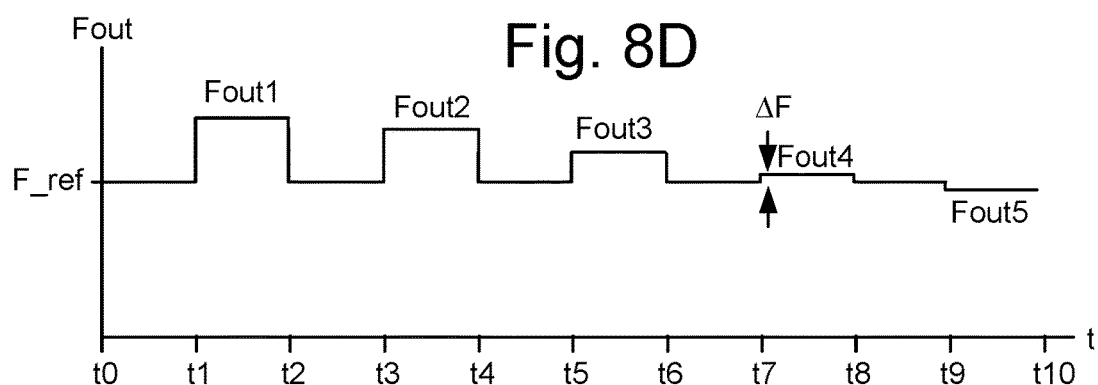
FIG. 8D is an example plot of an output frequency of the VCO 103 of FIG. 1 in a calibration process consistent with FIG. 8A-8C.

FIG. 8D is an example plot of an output frequency of the VCO 103 of FIG. 1 in a calibration process consistent with FIG. 8A-8C. The plot depicts the output frequencies Fout1-Fout5 of FIG. 8C versus time. F_ref is the frequency of the VCO's output signal when Vcc1 is applied. Consistent with FIG. 6, Fout1-Fout4>F_ref (since KVcc>0) and Fout5<F_ref (since KVcc<0). Note that in the fifth calibration cycle, the polarity of Fout-F_ref changes, e.g., from positive to negative. The polarity changes since Fout4-F_ref>0 and Fout5-F_ref<0. This can indicate the calibration code, e.g., either code4 or code5, is at an optimal value. Another way to identify the optimal code is to determine when the change in the frequency of the VCO's output signal in a calibration cycle is less than a threshold, ΔF. In this example, Fout4-F_ref<ΔF, indicating the code for cycle4 is optimal. Fout4-F_ref can be measured at t7-t8. As before, the difference in frequency can be measured or a difference in another metric which represents frequency, such as the difference in the count of cycles in the VCO's output signal, can be determined in each calibration cycle.

Figure 9:
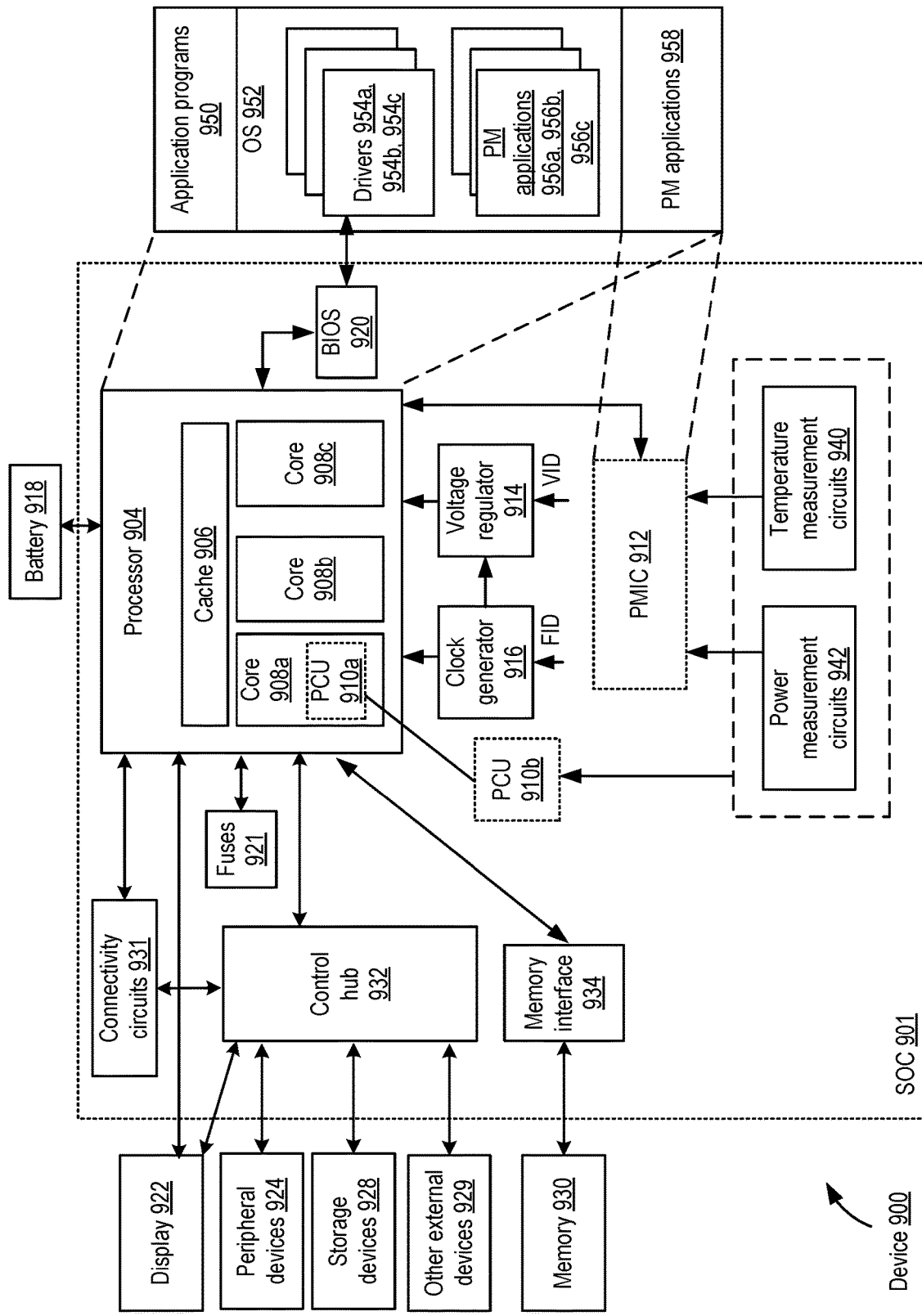
FIG. 9 illustrates a smart device or a computer system or a System-on-Chip (SoC) with apparatus and/or software in accordance with some embodiments.

FIG. 9 illustrates a smart device or a computer system or a System-on-Chip (SoC) with apparatus and/or software in accordance with some embodiments. In some embodiments, device 900 represents a computing device such as a computing tablet, a mobile phone or smartphone, a laptop, a desktop, an Internet-of-Things (IOT) device, a server, a wearable device, a set-top box, a wireless-enabled e-reader, or the like. It will be understood that certain components are shown generally, and not all components of such a device are shown in device 900.

In an example, the device 900 comprises a SoC (System-on-Chip) 901. An example boundary of the SoC 901 is illustrated using dotted lines, with some example components being illustrated to be included within the SoC.

In some embodiments, device 900 includes a processor 904. Processor 904 can include one or more physical devices, such as microprocessors, application processors, microcontrollers, programmable logic devices, or processing cores. The processing operations performed by processor 904 can include the execution of an operating platform or operating system on which applications and/or device functions are executed. The processing operations can include operations related to I/O (input/output) with a human user or with other devices, operations related to power management, operations related to connecting computing device 900 to another device. The processing operations may also include operations related to audio I/O and/or display I/O.

In some embodiments, the processor 904 includes multiple processing cores such as the example cores 908a, 908b, 908c. The cores may be implemented on a single integrated circuit (IC) chip which may include one or more shared and/or private caches, buses or interconnections, graphics and/or memory controllers, or other components.

In some embodiments, the processor 904 includes a cache 906. Sections of the cache 906 may be dedicated to individual cores or one or more sections of the cache 906 may be shared among two or more cores. The cache 906 may be split in different levels, e.g., level 1 (L1) cache, level 2 (L2) cache and level 3 (L3) cache.

In some embodiments, the processor 904 may include a fetch unit to fetch instructions from any storage devices such as the memory 930, for execution by the processor 904.

In some embodiments, the device 900 comprises connectivity circuits 931 such as hardware devices (e.g., wireless and/or wired connectors and communication hardware) and/or software components (e.g., drivers, protocol stacks), e.g., to enable the device 900 to communicate with external devices. The device 900 may be separate from the external devices, such as other computing devices, wireless access points or base stations, etc.

In some embodiments, the device 900 comprises a control hub 932, which represents hardware devices and/or software components related to interaction with one or more I/O devices. For example, the processor 904 may communicate with a display 922, peripheral devices 924, storage devices 928, and external devices 929 via the control hub 932. The control hub 932 may be a chip set, a Platform Control Hub (PCH), or the like.

The control hub 932 may connect additional devices to the device 900, e.g., through which a user might interact with the system. For example, connectivity circuits 931 may be coupled to the control hub 932, e.g., in addition to, or instead of, being coupled directly to the processor 904.

In some embodiments, the device 900 comprises a memory 930 coupled to the processor 904 via a memory interface 934. The memory 930 includes memory devices for storing information.

In some embodiments, the device 900 comprises temperature measurement circuits 940, e.g., for measuring temperature of various components of device 900. In an example, temperature measurement circuits 940 may be embedded, or coupled or attached to various components, whose temperature are to be measured and monitored. For example, temperature measurement circuits 940 may measure temperature of (or within) one or more of cores 908a, 908b, 908c, voltage regulator 914, memory 930, a mother-board of SoC 901, and/or any appropriate component of device 900.

In some embodiments, the device 900 comprises power measurement circuits 942, e.g., for measuring power consumed by one or more components of the device 900.

In some embodiments, the device 900 comprises one or more voltage regulator circuits 914, generally referred to as voltage regulators (VRs). VR 914 generates power supply signals at appropriate voltage levels, which may be supplied to operate components of the device 900. Merely as an example, VR 914 is illustrated to be supplying signals to processor 904 of device 900. In some embodiments, VR 914 receives one or more Voltage Identification (VID) signals, and generates the voltage signal at an appropriate level, based on the VID signals. Various type of VRs may be utilized for the VR 914. For example, VR 914 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 910a/b and/or PMIC 912. In some embodiments, each core has a network of distributed LDOs to provide efficient control for power management. The LDOs can be digital, analog, or a combination of digital or analog LDOs. In some embodiments, VR 914 includes current tracking apparatus to measure current through power supply rail(s).

In some embodiments, the device 900 comprises a clock generator 916 which generates clock signals at appropriate frequency levels for any appropriate components of the device 900. Merely as an example, clock generator 916 is illustrated to be supplying clock signals to the processor 904 and the VR 914. In some embodiments, clock generator 916 receives one or more Frequency Identification (FID) signals, and generates the clock signals at an appropriate frequency, based on the FID signals. The output clock signal, outclk, is one example of a clock signal.

The fuses 921 can be used to store an optimal calibration code for a filter as discussed in connection with FIG. 5A.

In some embodiments, the device 900 comprises a battery 918 supplying power to various components of the device 900 such as the processor 904.

In some embodiments, the device 900 comprises Power Control Units (PCUs) 910a and 910b. In an example, some sections of a PCU may be implemented by one or more processing cores 908a-908c, and these sections of the PCU are symbolically illustrated using a dotted box and labelled PCU 910a. In an example, some other sections of PCU may be implemented outside the processing cores, and these sections of PCU are symbolically illustrated using a dotted box and labelled as PCU 910b. The PCU may implement various power management operations for device 900.

In some embodiments, the device 900 comprises a Power Management Integrated Circuit (PMIC) 912, e.g., to implement various power management operations for the device 900.

In an example, the device 900 comprises the PCU and/or PMIC.

Various power management operations of device 900 may be performed by the PCU and/or by PMIC 912.

The clock generator 916 can comprise a phase locked loop (PLL), frequency locked loop (FLL), or any suitable clock source. In some embodiments, each core of processor 904 has its own clock source. A PLL can be provided such as depicted in FIG. 2. The PLL can include the oscillator 103 as discussed herein.

Also illustrated is an example software stack of device 900 (although not all elements of the software stack are illustrated). The processor 904 may execute application programs 950, Operating System 952, one or more Power Management (PM) specific application programs (e.g., generically referred to as PM applications 958). PM applications 958 may also be executed by the PCU and/or PMIC. OS 952 may also include one or more PM applications 956a, 956b, 956c. The OS 952 may also include various drivers 954a, 954b, 954c, some of which may be specific for power management purposes. In some embodiments, the device 900 may further comprise a Basic Input/output System (BIOS) 920. BIOS 920 may communicate with OS 952 via one or more of the drivers.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: an inductive-capacitance oscillator to receive a power supply signal from a voltage regulator and to provide an output signal having a frequency based on a voltage of the power supply signal; one or more notch filters coupled to the voltage regulator to filter the power supply signal according to a calibration code; and a control circuit coupled to the voltage regulator and the one or more notch filters, the control circuit is to optimize the calibration code to minimize a sensitivity of the inductive-capacitance based oscillator to noise in the power supply signal.

Example 2 includes the apparatus of example 1, wherein to optimize the calibration code, the control circuit is to determine a first frequency of the output signal when the calibration code is an initial value and the voltage of the power supply signal is a first voltage, to determine a second frequency of the output signal when the calibration code is the initial value and the voltage of the power supply signal is a second voltage, greater than the first voltage, and to adjust the calibration code based on whether the first frequency exceeds the second frequency.

Example 3 includes the apparatus of example 2, wherein, when the second frequency is less than the first frequency, the control circuit is to adjust the calibration code to increase a notch frequency of the one or more notch filters.

Example 4 includes the apparatus of example 2 or 3, wherein, when the second frequency is greater than the first frequency, the control circuit is to adjust the calibration code to decrease a notch frequency of the one or more notch filters.

Example 5 includes the apparatus of any one of examples 1 to 4, wherein the one or more notch filters are initially tuned to twice a running frequency of the output signal.

Example 6 includes the apparatus of any one of examples 1 to 5, wherein to optimize the calibration code, the control circuit is to perform calibration cycles to determine a value of the calibration code which minimizes a change in a frequency of the output signal due to a change in the voltage of the power supply signal.

Example 7 includes the apparatus of example 6, wherein the control circuit is to determine that the calibration cycles are completed when the change in the frequency of the output signal due to the change in the voltage of the power supply signal is less than a threshold.

Example 8 includes the apparatus of example 6 or 7, wherein in each calibration cycle, the control circuit is to set a value for the calibration code, determine a change in frequency of the output signal due a change in the voltage of the power supply signal, and determine an adjustment to the calibration code based on the change in the frequency.

Example 9 includes the apparatus of example 8, wherein the control circuit is to determine the adjustment to the calibration code based on a binary search.

Example 10 includes the apparatus of any one of examples 6 to 9, wherein the control circuit comprises a counter, the counter is to count a number of clock cycles in the output signal in a time window to determine the frequency of the output signal in each calibration cycle.

Example 11 includes the apparatus of any one of examples 1 to 10, wherein the inductive-capacitance oscillator is in a phase-locked loop (PLL); and the output signal is an output signal of the PLL.

Example 12 includes the apparatus of any one of examples 1 to 11, wherein the inductive-capacitance oscillator is in a clock data recovery (CDR) circuit of a receiver; and the output signal is to be used to recover a clock of a received signal.

Example 13 includes an apparatus, comprising: a memory to store instructions; and a processor to execute the instructions to optimize a calibration code for a notch filter, the notch filter to filter a power supply signal for a voltage-controller oscillator, wherein to optimize the calibration code, the processor is to execute the instructions to perform calibration cycles to determine a value of the calibration code which minimizes a change in a frequency of the output signal due to a change in the voltage of the power supply signal.

Example 14 includes the apparatus of example 13, wherein in each calibration cycle, the processor is to execute the instructions to set a value for the calibration code, determine a change in frequency of an output signal of the oscillator due a change in the voltage of the power supply signal, and determine an adjustment to the calibration code based on the change in the frequency.

Example 15 includes the apparatus of example 13 or 14, wherein the notch filter has a tunable notch frequency based on the calibration code.

Example 16 includes the apparatus of any one of examples 13 to 15, wherein the change in the voltage of the power supply signal is equal in each calibration cycle.

Example 17 includes the apparatus of any one of examples 13 to 16, wherein the change in the voltage of the power supply signal in each calibration cycle is less than 5%.

Example 18 includes an apparatus, comprising: a voltage regulator to output a power supply signal; a filter coupled to the voltage regulator, the filter is to filter phase noise in the power supply signal to provide a filtered power supply signal, the filter is tunable based on a calibration code; an oscillator coupled to the filter, the oscillator to provide an output signal on an output path based on the filtered power supply signal; and a control circuit coupled to the voltage regulator, the filter and the output path, wherein the control circuit is to perform calibration cycles for the filter, and to perform each calibration cycle, the control circuit is to determine a change in a frequency of the output signal due to a change in a voltage of the power supply signal and to adjust the calibration code based on the change in the frequency of the output signal.

Example 19 includes the apparatus of example 18, wherein the control circuit is to instruct the voltage regulator to output the power supply signal at two constant voltage levels in each calibration cycle.

Example 20 includes the apparatus of example 18 or 19, wherein the control circuit is to adjust the calibration code based on a polarity of the change in the frequency of the output signal.

Example 21 includes the apparatus of any one of examples 18 to 20, wherein to prepare the oscillator for normal operations in a phase-locked loop after powering up the phase-locked loop, the control circuit is to perform a coarse adjustment of the frequency of the output signal before and after the performance of the calibration cycles.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
    an inductive-capacitance oscillator to receive a power supply signal from a voltage regulator and to provide an output signal having a frequency based on a voltage of the power supply signal;
    one or more notch filters coupled to the voltage regulator to filter the power supply signal according to a calibration code; and
    a control circuit coupled to the voltage regulator and the one or more notch filters, the control circuit is to optimize the calibration code to minimize a sensitivity of the inductive-capacitance oscillator to noise in the power supply signal, wherein to optimize the calibration code, the control circuit is to determine a first frequency of the output signal when the calibration code is an initial value and the voltage of the power supply signal is a first voltage, to determine a second frequency of the output signal when the calibration code is the initial value and the voltage of the power supply signal is a second voltage, greater than the first voltage, and to adjust the calibration code based on whether the first frequency exceeds the second frequency.

2. The apparatus of claim 1, wherein:
    when the second frequency is less than the first frequency, the control circuit is to adjust the calibration code to increase a notch frequency of the one or more notch filters.

3. The apparatus of claim 1, wherein:
    when the second frequency is greater than the first frequency, the control circuit is to adjust the calibration code to decrease a notch frequency of the one or more notch filters.

4. The apparatus of claim 1, wherein:
    the one or more notch filters are initially tuned to twice a running frequency of the output signal.

5. The apparatus of claim 1, wherein:
    to optimize the calibration code, the control circuit is to perform calibration cycles to determine a value of the calibration code which minimizes a change in a frequency of the output signal due to a change in the voltage of the power supply signal.

6. The apparatus of claim 5, wherein:
    the control circuit is to determine that the calibration cycles are completed when the change in the frequency of the output signal due to the change in the voltage of the power supply signal is less than a threshold.

7. The apparatus of claim 5, wherein:
    in each calibration cycle, the control circuit is to set a value for the calibration code, determine a change in frequency of the output signal due a change in the voltage of the power supply signal, and determine an adjustment to the calibration code based on the change in the frequency.

8. The apparatus of claim 7, wherein:
    the control circuit is to determine the adjustment to the calibration code based on a binary search.

9. The apparatus of claim 5, wherein:
    the control circuit comprises a counter, the counter is to count a number of clock cycles in the output signal in a time window to determine the frequency of the output signal in each calibration cycle.

10. The apparatus of claim 1, wherein:
    the inductive-capacitance oscillator is in a phase-locked loop (PLL); and
    the output signal is an output signal of the PLL.

11. The apparatus of claim 1, wherein:
the inductive-capacitance oscillator is in a clock data recovery circuit of a receiver; and
the output signal is to be used to recover a clock of a received signal.

12. An apparatus, comprising:
a memory to store instructions; and
a processor to execute the instructions to optimize a calibration code for a notch filter, the notch filter to filter a power supply signal for a voltage-controlled oscillator, wherein to optimize the calibration code, the processor is to execute the instructions to perform calibration cycles to determine a value of the calibration code which minimizes a change in a frequency of an output signal of the voltage-controlled oscillator due to a change in a voltage of the power supply signal, wherein the change in the voltage of the power supply signal is equal in each calibration cycle.

13. The apparatus of claim 12, wherein in each calibration cycle, the processor is to execute the instructions to set a value for the calibration code, determine a change in frequency of an output signal of the oscillator due to a change in the voltage of the power supply signal, and determine an adjustment to the calibration code based on the change in the frequency.

14. The apparatus of claim 12, wherein:
the notch filter has a tunable notch frequency based on the calibration code.

15. The apparatus of claim 12, wherein:
the change in the voltage of the power supply signal in each calibration cycle is less than 5%.

16. An apparatus, comprising:
a voltage regulator to output a power supply signal;
a filter coupled to the voltage regulator, the filter is to filter phase noise in the power supply signal to provide a filtered power supply signal, the filter is tunable based on a calibration code;
an oscillator coupled to the filter, the oscillator to provide an output signal on an output path based on the filtered power supply signal; and
a control circuit coupled to the voltage regulator, the filter, and the output path, wherein the control circuit is to perform calibration cycles for the filter, and to perform each calibration cycle, the control circuit is to determine a change in a frequency of the output signal due to a change in a voltage of the power supply signal and to adjust the calibration code based on the change in the frequency of the output signal, wherein the control circuit is to instruct the voltage regulator to output the power supply signal at two constant voltage levels in each calibration cycle.

17. The apparatus of claim 16, wherein:
the control circuit is to adjust the calibration code based on a polarity of the change in the frequency of the output signal.

18. The apparatus of claim 16, wherein:
to prepare the oscillator for normal operations in a phase-locked loop after powering up the phase-locked loop, the control circuit is to perform a coarse adjustment of the frequency of the output signal before and after the performance of the calibration cycles.

* * * * *